United States Patent
Park et al.

(10) Patent No.: US 11,656,283 B2
(45) Date of Patent: May 23, 2023

(54) METHOD FOR DETERMINING DISPERSIBILITY OF ELECTRODE MATERIAL LAYER

(71) Applicant: LG CHEM, LTD., Seoul (KR)

(72) Inventors: Ji Hye Park, Daejeon (KR); Seok Koo Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 112 days.

(21) Appl. No.: 17/047,873

(22) PCT Filed: Jul. 11, 2019

(86) PCT No.: PCT/KR2019/008599
§ 371 (c)(1),
(2) Date: Oct. 15, 2020

(87) PCT Pub. No.: WO2020/091188
PCT Pub. Date: May 7, 2020

(65) Prior Publication Data
US 2021/0156922 A1  May 27, 2021

(30) Foreign Application Priority Data
Oct. 30, 2018 (KR) .................. 10-2018-0131267

(51) Int. Cl.
*G01R 31/367* (2019.01)
*H01M 10/0525* (2010.01)
(Continued)

(52) U.S. Cl.
CPC ......... *G01R 31/367* (2019.01); *G01N 27/041* (2013.01); *H01M 10/0525* (2013.01);
(Continued)

(58) Field of Classification Search
CPC .. G01R 31/367; G01R 31/392; G01R 31/396; G01N 27/041; G01N 27/04;
(Continued)

(56) References Cited

U.S. PATENT DOCUMENTS

2010/0201385 A1   8/2010  Menil et al.
2011/0294012 A1  12/2011  Nakabayashi et al.
(Continued)

FOREIGN PATENT DOCUMENTS

CN   101743468 A   6/2010
CN   103107338 A   5/2013
(Continued)

OTHER PUBLICATIONS

International Search Report (with partial translation) and Written Opinion dated Oct. 31, 2019, issued in corresponding International Patent Application No. PCT/KR2019/008599.
(Continued)

*Primary Examiner* — Daniel R Miller
*Assistant Examiner* — Christian T Bryant
(74) *Attorney, Agent, or Firm* — Morgan, Lewis & Bockius LLP

(57) ABSTRACT

The present invention discloses a method for determining dispersibility, comprising (a) selecting two random points (1-1') of an electrode material layer, (b) finding a difference $\Delta 1$ of an absolute value of two voltage values by measuring voltages between the two points (1-1') in different current directions, (c) selecting two other random points (2-2' to n-n', where n is an integer that is equal to or greater than 2) that are different from two points selected in the process (a) and, and repeating the processes (a) and (b) at least once to find $\Delta 2$ to $\Delta n$, (d) finding a mean value of differences $\Delta 1$ to $\Delta n$ of the absolute values obtained by repeating the process
(Continued)

(b) and the process (c), and (e) finding a standard deviation of $\Delta1$ to $\Delta n$ from the mean value.

10 Claims, 3 Drawing Sheets

(51) Int. Cl.
  *G01R 31/396* (2019.01)
  *H01M 4/13* (2010.01)
  *G01R 31/392* (2019.01)
  *H01M 4/02* (2006.01)
  *G01N 27/04* (2006.01)

(52) U.S. Cl.
  CPC ............ *G01N 27/04* (2013.01); *G01R 31/392* (2019.01); *G01R 31/396* (2019.01); *H01M 4/02* (2013.01); *H01M 4/13* (2013.01); *Y02E 60/10* (2013.01)

(58) Field of Classification Search
  CPC ...... H01M 10/0525; H01M 4/13; H01M 4/02; Y02E 60/10

See application file for complete search history.

(56) References Cited

U.S. PATENT DOCUMENTS

| | | | |
|---|---|---|---|
| 2013/0089780 | A1 | 4/2013 | Uezono |
| 2016/0056472 | A1 | 2/2016 | Abe et al. |

FOREIGN PATENT DOCUMENTS

| | | |
|---|---|---|
| CN | 108061743 A1 | 5/2018 |
| CN | 108519407 A | 9/2018 |
| JP | 2005-251537 A | 9/2005 |
| JP | 2009-229373 A | 10/2009 |
| JP | 2010-122122 A | 6/2010 |
| JP | 5323375 B2 | 10/2013 |
| JP | 2014-025850 A | 2/2014 |
| JP | 2014-081362 A | 5/2014 |
| JP | 2015-018764 A | 1/2015 |
| JP | 5975274 B2 | 8/2016 |
| JP | 6210929 B2 | 10/2017 |
| JP | 6345399 B2 | 6/2018 |
| KR | 10-2013-0064288 A | 6/2013 |
| KR | 10-1579336 B1 | 12/2015 |
| KR | 10-2017-0065175 A | 6/2017 |

OTHER PUBLICATIONS

Extended European Search Report issued by the European Patent Office dated Jul. 15, 2021 in corresponding European Patent Application No. 19880666.3.

Kwon et al., "Toward Uniformly Dispersed Battery Electrode Composite Materials: Characteristics and Performance," Applied Materials & Interfaces, vol. 8, No. 5, 2016, pp. 3452-3463.

METHOD FOR DETERMINING DISPERSIBILITY OF ELECTRODE MATERIAL LAYER

TECHNICAL FIELD

Cross-Reference to Related Application

This application claims the benefits of Korean Patent Application No. 10-2018-0131267 filed on Oct. 30, 2018 with the Korean Intellectual Property Office, the disclosure of which is incorporated herein by reference in its entirety.

The present invention relates to a method for checking dispersibility of an electrode material layer, and particularly relates to a method for checking dispersibility of an electrode material layer by measuring a voltage of an electrode material layer.

BACKGROUND ART

As technical developments and demands on mobile devices increase, demands on rechargeable batteries as energy sources are steeply increasing, and a lithium rechargeable battery that has a high energy density and operating potential, a long cycle lifespan, and a low self-discharging rate is becoming commercially available and is widely used from among the rechargeable batteries.

Further, as interest in environmental issues has recently increased, studies on electric vehicles (EV) and hybrid electric vehicles (HEV) that may substitute for vehicles that use fossil fuels such as gasoline or diesel, one of main causes of air pollution, are in progress. Lithium rechargeable batteries with a high energy density, a high discharging voltage, and output stability are mainly studied and used as power sources of the electric vehicles (EV) and the hybrid electric vehicles (HEV)

The lithium rechargeable battery is generally manufactured by installing an electrode assembly including a positive electrode, a negative electrode, and a separation film into a battery case while impregnated in an electrolyte solution, and the positive electrode or the negative electrode is manufactured by dispersing an electrode material such as an active material, a conductive material, or a binder in a solvent to manufacture an electrode slurry, and coating the same on an electrode current collector, drying the same, and rolling the same.

In this instance, performance of the lithium rechargeable battery is influenced by the manufactured electrode. For example, performance of the lithium rechargeable battery depends on surface uniformity when an electrode slurry is applied to the electrode current collector, adherence of the electrode current collector and the electrode material when it is dried, and a content ratio of electrode materials.

Among them, dispersibility of materials configuring the electrode material is very important in improving performance of the lithium rechargeable battery. Among them, particularly, when dispersibility of the conductive material is not well performed, electron conductivity deviation of the electrode increases, which influences overall performance such as an output characteristic, a rate characteristic, and a lifespan characteristic of the lithium rechargeable battery because of reasons such as an increase of resistance.

Therefore, an electrode with very bad dispersibility is defective, and it substantially generates various problems according to the use of the battery, but there is no method for determining the dispersibility with a nondestructive scheme, so no defect on the electrode dispersibility is found and customer complaints continue.

Accordingly, there is a high necessity for a method for determining dispersibility of an electrode material layer according to a nondestructive scheme for determining quality with respect to uniform distribution inside an electrode.

DISCLOSURE

Technical Problem

The present invention has been made in an effort to solve the problems of the related art and technical objects which have been requested from the past.

The present invention has been made in an effort to provide a method for determining dispersibility of an electrode material layer according to a nondestructive scheme by measuring voltages in different current directions at random points of the electrode material layer.

Technical Solution

An exemplary embodiment of the present invention provides a method for determining dispersibility of an electrode material layer of an electrode for a lithium rechargeable battery wherein, regarding the electrode, an electrode material layer including an active material, a conductive material, and a binder is formed on at least one side of an electrode current collector, the determining of dispersibility of an electrode material layer includes (a) selecting two random points (1-1') of an electrode material layer, (b) finding a difference Δ1 of an absolute value of two voltage values by measuring voltages between the two points (1-1') in different current directions, (c) selecting two other random points (2-2' to n-n', where n is an integer that is equal to or greater than 2) that are different from two points selected in the process (a) and, and repeating the processes (a) and (b) at least once to find Δ2 to Δn, (d) finding a mean value of differences Δ1 to Δn of the absolute values obtained by repeating the process (b) and the process (c), and (e) finding a standard deviation of Δ1 to Δn from the mean value, and dispersibility of the electrode material layer is determined to be higher as the standard deviation value of the process (e) becomes smaller.

MODE FOR INVENTION

Figure 1:
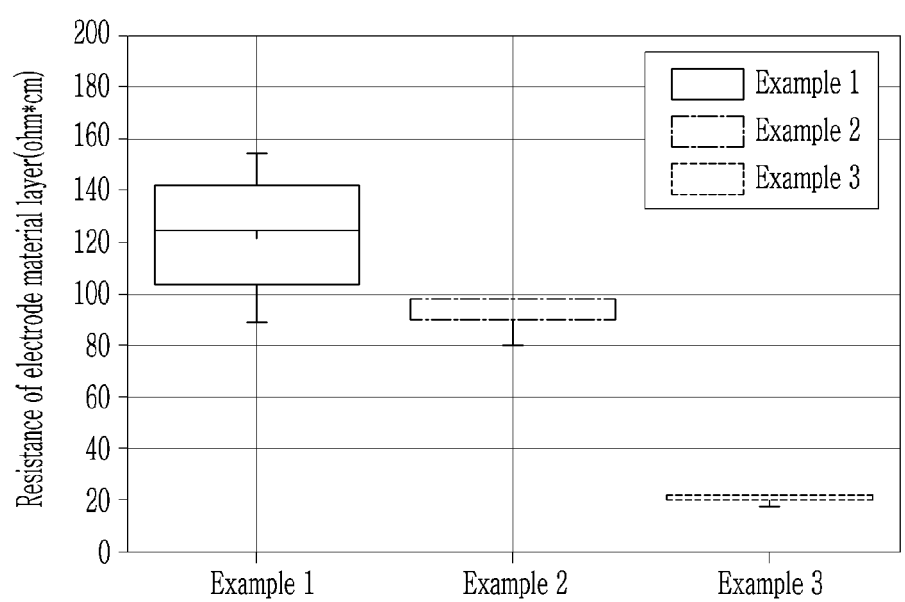
FIG. 1 shows an electrode material layer resistance graph according to Reference Experimental Example 1.

The present invention will be described in further detail for better understanding of the present invention.

Terms or words used in the present specification and claims, which will be described below, should not be interpreted as being limited to typical or dictionary meanings, but should be interpreted as having meanings and concepts which comply with the technical spirit of the present invention, based on the principle that an inventor can appropriately define the concept of the terms to describe his/her own invention in the best manner.

The terminology used herein is for the purpose of describing particular embodiments only and is not intended to be limiting of the invention. The singular forms are intended to include the plural forms as well, unless the context clearly indicates otherwise.

It will be further understood that the terms "include", "have", or "possess" specify the presence of stated features, steps, components, or combinations thereof, but do not preclude the presence or addition of one or more other features, steps, components, or combinations thereof.

According to an exemplary embodiment of the present invention, a method for determining dispersibility of an electrode material layer of an electrode for a lithium rechargeable battery is provided wherein, regarding the electrode, an electrode material layer including an active material, a conductive material, and a binder is formed on at least one side of an electrode current collector, the determining of dispersibility of an electrode material layer includes (a) selecting two random points (1-1') of an electrode material layer, (b) finding a difference $\Delta 1$ of an absolute value of two voltage values by measuring voltages between the two points (1-1') in different current directions, (c) selecting two other random points (2-2' to n-n', where n is an integer that is equal to or greater than 2) that are different from two points selected in the process (a) and, and repeating the processes (a) and (b) at least once to find $\Delta 2$ to $\Delta n$, (d) finding a mean value of differences $\Delta 1$ to $\Delta n$ of the absolute values obtained by repeating the process (b) and the process (c), and (e) finding a standard deviation of $\Delta 1$ to $\Delta n$ from the mean value, and dispersibility of the electrode material layer is determined to be higher as the standard deviation value of the process (e) becomes smaller.

As described above, dispersibility of the electrode materials, such as an active material, a conductive material, and a binder, included in the electrode material layer is very important in realization of performance of the rechargeable battery, and accordingly, there is a need to remove a defect of an electrode with the dispersibility that is very much deteriorated, but there is no method for determining the dispersibility according to a nondestructive scheme, thereby increasing discontent of customers.

Accordingly, the inventors of the present specification repeatedly performed studies to find that, when voltages between two points of the electrode material layer are measured in different current directions, their current directions are different, so they must be different in the marks of +/− and their absolute value, that is the voltage size must be the same, but the absolute values of the voltages have differences. Therefore, when the difference of the absolute values of the voltages is obtained from various random points to find a standard deviation thereof, it is found that dispersibility of the electrode material layer may be predicted from the standard deviation value, and the present invention was completed.

A method for determining dispersibility of an electrode material layer according to the present invention will now be described in detail.

First, a process (a) for selecting two random points (1-1') of an electrode material layer is performed.

Positions of the initially selected random two points are not limited, and are selectable when they are not in an overlapping range on the electrode material layer.

However, to clarify the dispersibility, it is desirable for the two selected points to have a predetermined distance therebetween. This is because, when the distance is very short, the difference of the absolute values of the voltages may not substantially exist, and when various points are selected in this way, the standard deviation value may be low regardless of dispersibility of electrodes.

Therefore, it is preferable to select the two points with a predetermined level of distance, for example, that is equal to or greater than 1 mm, and in detail, that is equal to or greater than 5 mm, and in order to clarify overall dispersibility of electrodes, it is preferable to select the points from respective sides with respect to the center axis of the electrode in a plan view, that is, one from the left and the other from the right.

Next, a process (b) for finding a difference $\Delta 1$ of absolute values of two voltage values by measuring the voltage between the two points (1-1') in different current directions is performed.

The voltage between the two selected points is measured, and in this instance, the voltage is measured twice by changing the current direction into an opposite one. As described, when changing the current direction and measuring the voltage at the same position, its size must be the same and it must be measured by changing the marks, that are +/− values, but substantially, the sizes are different.

This is caused by the difference of current distributions caused by dispersibility of the electrode material layer of the electrode.

Therefore, the difference of absolute values may be considered as a criterion for measuring dispersibility of electrode materials of the electrode material layer.

In this instance, the size of current for measuring the voltage is not limited, and in detail, it may be 1 $\mu$A to 100 mA.

When the current size digresses from the range and is less than 1 $\mu$A, it is difficult to measure the difference of voltages, and when the same is greater than 100 mA, there is a drawback of precision, so it is most preferable to measure the same within the range.

In another way, single performance of the process may not clarify dispersibility of the electrode material layer since it may become different depending on what random point is selected.

In other words, two points of a portion with a small difference of absolute values may be selected when the electrode substantially has no good dispersibility of the electrode material layer, so the accuracy may not be obtained for one performance.

Therefore, in the present invention, the above-noted processes (a) and (b) may be performed at least twice.

In detail, a process (c) for selecting two random points (2-2' to n-n', where n is an integer ranging that is equal to or greater than 2) that are different from the two points selected in the process (a), and repeating the processes (a) and (b) at least once to find $\Delta 2$ to $\Delta n$, is performed.

Here, the two selected random points are different from each other.

That is, in a first step, two points (2-2') that are different from the two points (1-1') selected in the process (a) are selected, and a voltage therebetween is measured in different current directions to find a difference $\Delta 2$ of the absolute value of the two voltage values. The above-noted process is repeated once to find up to $\Delta 2$, find a mean value of $\Delta 1$ and $\Delta 2$, and thereby find a standard deviation.

However, in order to more accurately determine dispersibility of the electrode material layer, the above-noted process may be further performed.

That is, after the value of $\Delta 2$ is found, the two points (1-1'), the point (2-2') selected by one repetition, and two other points (3-3') are selected, a voltage is respectively measured in different current directions to find a difference Δ3 of absolute values of two voltage values, the points (1-1', 2-2', and 3-3') and two other points (4-4') are selected, and a voltage among them is respectively measured in different current directions to find a difference Δ4 of absolute values of two voltage values and find up to Δn.

In this instance, in detail, the processes (a) and (b) may be repeated at least five times in the process (c) to find Δ2 to Δn (n is an integer that is equal to or greater than 6), and when a difference of absolute values of six voltage values is found, accuracy of determining dispersibility of the electrode material layer may be very much improved.

Further, the voltage measurement of the process (a) to process (c) is not limited, it may be performed by using a machine for charging and discharging a battery, a structure for measuring a voltage is not limited, and for a simpler method, the processes (a) to (c) that must be performed n times by using an electrode resistance measuring model including a voltage probe and a current probe may be performed simultaneously.

In detail, the electrode resistance measuring model may include at least four voltage probes and at least two current probes.

That is, as at least two current probes are included, the current may flow in other directions, and as at least four voltage probes are included, at least two pairs of different points may be selected, so the processes (a) to (c) may be performed once.

As described above, on order to further improve the accuracy of determining dispersibility of the electrode material layer according to the present invention, it is preferable to form at least six pairs of different points, so the electrode resistance measuring model may, in detail, include at least twelve voltage probes and at least two current probes.

Here, the current probe may allow the current to flow in two directions, so two current probes will be sufficient.

Further, the electrode resistance measuring model may further include a ground probe for performing a grounding function.

In this instance, the size of the current flowing to the electrode resistance measuring model is already described above.

After the processes (a) to (c) as described above, a process (d) for finding a mean value of differences Δ1 to Δn of absolute values obtained from repetition of the process (b) and the process (c) is performed.

The mean value corresponds to conventional and general methods, and it may be found as follows.

Mean value($X$)=(Δ1+Δ2+Δ3 ... +Δ$n$)/$n$

For example, when the voltage is measured at two pairs of two different points, the mean value may be (Δ1+Δ2)/2, and when the voltage is measured at six pairs of two different points, the mean value may be (Δ1+Δ2+Δ3+Δ4+Δ5+Δ6)/6.

Here, the process for finding a mean value is to find a standard deviation, and the mean value may be an index for determining dispersibility of the electrode material layer. This is because the mean value does not indicate a dispersion degree of obtained values, but it functions as a reference point by which the values are gathered.

Hence, the standard deviation for determining the dispersion degree of the obtained values may be found, and it may then be used as an index for determining dispersibility of the electrode material layer.

Therefore, the method for determining dispersibility of an electrode material layer according to the present invention must finally perform a process (e) for finding a standard deviation of Δ1 to Δn from the mean value.

The process for finding the standard deviation (a) also corresponds to the general methods, and it may be found as follows.

$\sigma^2=\{(X-\Delta 1)^2+(X-\Delta 2)^2+(X-\Delta 3)^2 \ldots +(X-\Delta n)^2\}/n$ That is, the standard deviation ($\sigma$) is a value of root 2 of $\{(X-\Delta 1)^{2+}(X-\Delta 2)^{2+}(X-\Delta 3)^2 \ldots +(X-\Delta n)^2\}/n$.

For example, when the voltage is measured at two pairs of two different points, the standard deviation may be a value of root 2 of $\{(X-\Delta 1)^2+(X-\Delta 2)^2\}/2$, and when the voltage is measured at six pairs of two different points, the standard deviation may be a value of root 2 of $\{(X-\Delta 1)^2+(X-\Delta 2)^2+(X-\Delta 3)^2+(X-\Delta 4)^2+(X-\Delta 5)^2+(X-\Delta 6)^2\}/6$.

Dispersibility of the electrode material layer may be determined from the standard deviation found as described above.

In detail, this means that the greater the standard deviation value is, the greater the difference distribution of the voltage value is, that is, it has a widely spread form, so the voltage value is not constant but is different at many points. Therefore, this signifies that the greater the standard deviation value is, the worse the dispersibility of the electrode material layer is, and the smaller the standard deviation value is, the better the dispersibility of the electrode material layer is.

According to study by the inventors of the present specification, when the standard deviation value is equal to or less than 0.005, in detail, when the same is equal to or less than 0.002, it is found that dispersibility of the electrode material layer is excellent.

In other words, depending on the client's request, when the standard deviation value is equal to or less than 0.005, dispersibility of the electrode may be relatively good, and in the case of further accurate determination, it may be determined to be good when the standard deviation value is equal to or less than 0.002.

In another way, electrode materials influencing dispersibility of the electrode material layer may include an active material, a conductive material, and a binder.

Here, the active material is set according to a type of the electrode, and for example, when the electrode is a positive electrode, the active material may include, as a positive active material, for example, a lamellar compound such as a lithium cobalt oxide ($LiCoO_2$) or a lithium nickel oxide ($LiNiO_2$), or a compound substituted with one or more transition elements; a lithium manganese oxide with a chemical formula of $Li_{1+x}Mn_{2-x}O_4$ (here, x is 0 to 0.33), $LiMnO_3$, $LiMn_2O_3$, or $LiMnO_2$; a vanadium oxide such as a lithium copper oxide ($Li_2CuO_2$); $LiV_3O_8$, $LiFe_3O_4$, $V_2O_5$, or $Cu_2V_2O_7$; an Ni site type lithium nickel oxide expressed with a chemical formula $LiNi_{1-x}M_xO_2$ (here, M=Co, Mn, Δ1, Cu, Fe, Mg, B, or Ga, and x=0.01 to 0.3); a lithium manganese composite oxide expressed with a chemical formula $LiMn_{2-x}M_xO_2$ (here, M=Co, Ni, Fe, Cr, Zn, or Ta, and x=0.01 to 0.1) or $Li_2Mn_3MO_8$ (here, M=Fe, Co, Ni, Cu, or Zn); a lithium manganese composite oxide with a spinel structure expressed as $LiNi_xMn_{2-x}O_4$; $LiMn_2O_4$, part of Li of which is substituted with alkaline-earth metal ions; a disulfide compound; and $Fe_2(MoO_{43})$, but is not limited thereto.

For another example, when the electrode is a negative electrode, the active material may include, as a negative active material, for example, at least one carbon-based material selected from among crystalline artificial graphite, crystalline natural graphite, amorphous hard carbon, low crystalline soft carbon, carbon black, acetylene black, ketjen black, super P, graphene, and fibrous carbon, an Si-based material, and a metal composite oxide such as $Li_xFe_2O_3$ ($0 \le x \le 1$), $Li_xWO_2$ ($0 \le x \le 1$), $Sn_xMe_{1-x}Me'_yO_z$ (Me: Mn, Fe, Pb, Ge; Me': Al, B, P, Si, Group 1, Group 2, or Group 3 elements of the periodic table, and a halogen; $0 \le x \le 1$; $1 \le y \le 3$; $1 \le z \le 8$); a lithium metal; a lithium alloy; a silicon-based alloy; a tin-based alloy; a metal oxide such as SiO, $SiO_2$, SnO, $SnO_2$, PbO, $PbO_2$, $Pb_2O_3$, $Pb_3O_4$, $Sb_2O_3$, $Sb_2O_4$, $Sb_2O_5$, GeO, $GeO_2$, $Bi_2O_3$, $Bi_2O_4$, and $Bi_2O_5$; a conductive polymer such as polyacetylene; a Li—Co—Ni-based material; a titanium oxide; and a lithium titanium oxide, but is not limited thereto.

The conductive material may be added within a range of 1 to 30 wt % on the electrode material layer. The conductive material is not specifically limited as long as it does not generate a chemical change in the corresponding battery and has conductivity, and for example, carbon black such as acetylene black, ketjen black, channel black, furnace black, lamp black, or summer black; a conductive fiber such as a carbon fiber or a metal fiber; a metal powder such as carbon fluoride, aluminum, or nickel powder; a conductive whisker such as a zinc oxide or a potassium titanate; a conductive metal oxide such as a titanium oxide; and a conductive material such as a polyphenylene derivative may be used.

The binder may be added in the range of 1 to 30 wt % on the electrode material layer. The binder is not specifically limited when it combines an active material and conductive materials and combines the electrode material layer to a current collector, and for example, it may be selected from among polyvinylidene fluoride (PVdF), polyvinyl alcohol, carboxylmethyl cellulose (CMC), starch, hydroxypropyl cellulose, regenerated cellulose, polyvinylpyrrolidone, tetrafluoroethylene, polyethylene, polypropylene, ethylene-propylene-diene terpolymer (EPDM), sulfonated EPDM, styrene butadiene rubber (SBR), and a fluoro rubber, and it may include a binder that is appropriate for respective active material layers in consideration of elastic recovery and rigidity of the binders.

In addition, the electrode material may further include a filler.

The filler is selectively used as a component for suppressing expansion of the electrode, and it may be added within the range of 5 wt % on the electrode material layer. A fiber material is not specifically limited as long as it does not cause a chemical change in the corresponding battery, and for example, an olefin-based polymer such as a polyethylene or a polypropylene, and a fiber material such as a glass fiber or a carbon fiber, are used.

The electrode material layer is formed on the electrode current collector, and in this instance, the electrode current collector is generally made to be 3 to 500 μm thick, and materials that do not cause chemical changes to the present battery and have conductivity are not specifically limited, but for example, copper, stainless steel, aluminum, nickel, titanium, fired carbon, a surface-treated material on a surface made of copper, aluminum, or stainless steel with carbon, nickel, titanium, or silver, and an aluminum-cadmium alloy, may be used. Further, a bonding force of an electrode active material may be reinforced by forming fine protrusions and depressions on the surface of the current collector, and it may be used in various forms such as a film, a sheet, a foil, a net, a porous body, a foam, or a non-woven fabric.

The above-noted electrodes may be manufactured with a lithium rechargeable battery, a battery module, or a battery pack, and a structure and a manufacturing method thereof are known to a person skilled in the art, and a detailed description on the lithium rechargeable battery, the battery module, and the battery pack will be omitted in the present specification.

The content of the present invention will now be described with reference to examples, the examples exemplify the present invention, and scopes of the present invention are not limited by the same.

Example 1

Amounts of a positive active material $LiNi_{0.6}Mn_{0.2}Co_{0.2}O_2$: a CNT (conductive material): PVdF (a binder) may be measured to be 98.48: 0.42: 1.10, they are put into an NMP solvent, and they are mixed for one hour at 1000 rpm in a homo mixer to manufacture a positive mixture slurry.

They are coated to be 100 μm thick on an aluminum foil with a thickness of 20 μm, and they are dried and rolled to manufacture a positive electrode.

Example 2

In Example 2, the positive electrode is manufactured in a like manner of Example 1, except for the manufacturing of the positive mixture slurry by mixing it for an hour 2000 rpm.

Example 3

In the Example 3, the positive electrode is manufactured in a like manner of Example 1, except for the manufacturing of the positive mixture slurry by mixing it for an hour at 3000 rpm.

Reference Experimental Example 1

Regarding the positive electrode manufactured in Examples 1 to 3, resistance distribution of a positive electrode material layer (electrode material layer) is measured five times with a current size of 100 μA by changing positions, by using an electrode resistance measuring model (Company: HIOKI, and Model: XF057) including one ground probe, 25 voltage probes, and 20 current probes, and corresponding results are shown with box plots in FIG. 1.

Experimental Example 1

Figure 2:
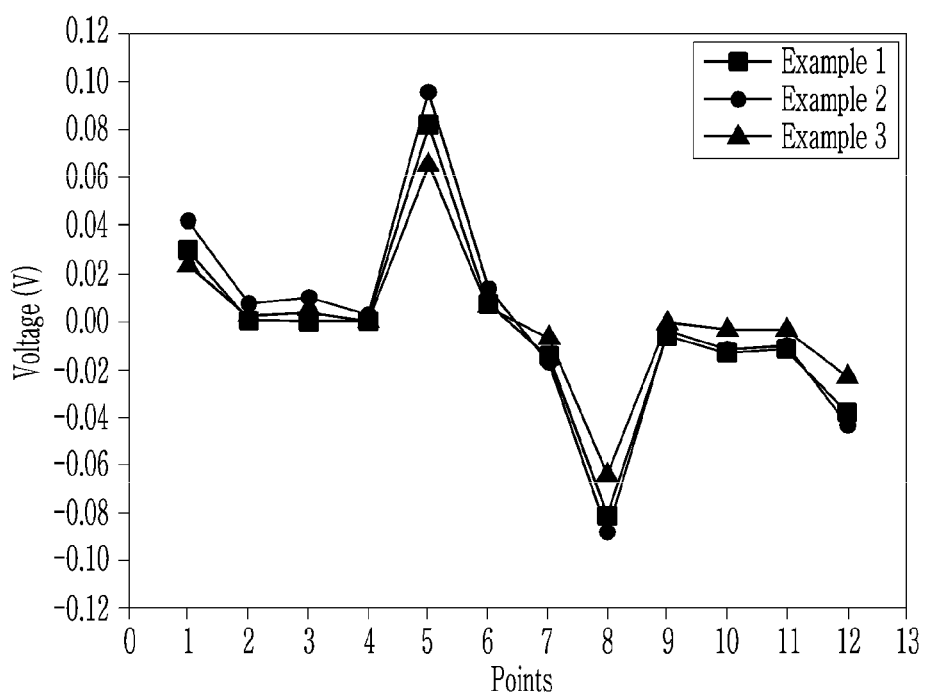
FIG. 2 shows a voltage graph according to Experimental Example 1.

The positive electrode manufactured in Examples 1 to 3 is measured once with the current size of 100 μA by using the electrode resistance measuring model (Company: HIOKI, and Model: XF057) including one ground probe, 25 voltage probes, and 20 current probes, and from among them, voltage values with different current directions from six pairs of two different points are obtained from twelve random voltage probes, and corresponding results are shown in FIG. 2.

Figure 3:
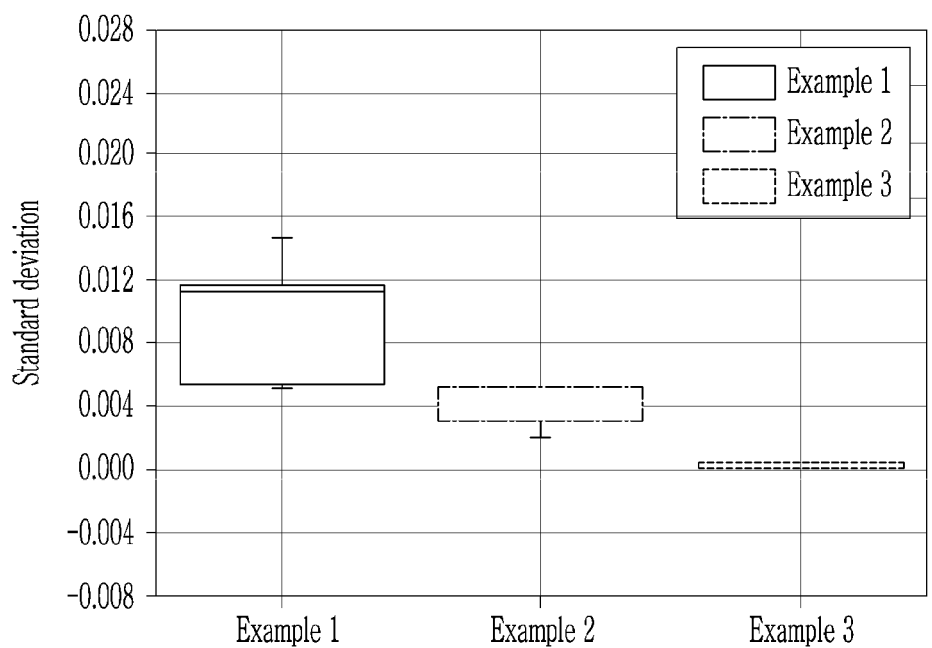
FIG. 3 shows a graph of a voltage standard deviation according to Experimental Example 1.

Further, based on the obtained voltage values, a value dV (dispersion $\sigma^2$) is shown with a box plot in FIG. 3, from which standard deviation is found and is shown in Table 1.

TABLE 1

|  | Example 1 | Example 2 | Example 3 |
| --- | --- | --- | --- |
| Standard deviation | 0.0096 | 0.0046 | 0.000215 |

Referring to FIG. 3 together with FIG. 1, it is found that the form of resistance of the electrode material layer of FIG. 1 is similar to the form of FIG. 3 showing the form of standard deviation and dispersion. FIG. 1 shows measuring of five points and corresponding resultant data so as to accurately measure the entire distribution of resistance of the positive electrode, and it is found that the accuracy of the measurement method according to the present specification is very high when considering that very similar results are generated in FIG. 3 when the dispersion and standard deviation are found based on voltage values at one point. From this, it is found that the method according to the present invention may be a criterion for determining dispersibility of the electrode material layer.

Further, referring to Table 1, FIG. 1, and FIG. 3, it is found that dispersibility is further excellent as the standard deviation value reduces.

Those of ordinary skill in the art to which the present invention belongs will be able to make various applications and modifications within the scope of the present invention.

INDUSTRIAL APPLICABILITY

As described above, according to the present invention, the process for selecting two random points of the electrode material layer, respectively measuring the voltage between them in different current directions, and finding the difference of the absolute values of the two voltage values is performed at least twice by changing the two random points, and the standard deviation thereof is found based on the differences of the absolute values obtained from the above-noted process, thereby anticipating and determining dispersibility of the electrode material layer from the standard deviation value according to a nondestructive scheme.

The invention claimed is:

1. A method for determining dispersibility of an electrode material layer of an electrode for a lithium rechargeable battery, comprising:
    preparing a mixture comprising the an active material, a conductive material, and a binder,
    disposing the mixture on at least one side of an electrode current collector,
    drying and rolling the electrode current collector on which the mixture is disposed to prepare the electrode material layer,
    (a) selecting two random points (1-1') of the electrode material layer,
    (b) finding a difference $\Delta 1$ of an absolute value of two voltage values by measuring voltages between the two points (1-1') in different current directions,
    (c) selecting two other random points (2-2' to n-n', where n is an integer that is equal to or greater than 2) that are different from the two points selected in the process (a) and, and repeating the processes (a) and (b) at least once to find $\Delta 2$ to $\Delta n$,
    (d) finding a mean value of differences $\Delta 1$ to $\Delta n$ of the absolute values obtained by repeating the process (b) and the process (c), and
    (e) finding a standard deviation of $\Delta 1$ to $\Delta n$ from the mean value,
    wherein, dispersibility of the electrode material layer is determined to be higher as the standard deviation value of the process (e) becomes smaller, and
    the electrode material layer including an active material, a conductive material, and a binder is formed on at least one side of an electrode current collector.

2. The method of claim 1, wherein the two points selected in the process (a) have a distance therebetween that is equal to or greater than 1 mm.

3. The method of claim 1, wherein the two points selected in the process (a) are selected on each side with respect to a center axis of an electrode in a plan view.

4. The method of claim 1, wherein the processes (a) and (b) are repeated at least five times in the process (c) to find $\Delta 2$ to $\Delta n$, where n is an integer that is equal to or greater than 6.

5. The method of claim 1, wherein a voltage measurement of the process (a) to the process (c) is simultaneously performed by using an electrode resistance measuring model including a voltage probe and a current probe.

6. The method of claim 5, wherein the electrode resistance measuring model includes at least four voltage probes and at least two current probes.

7. The method of claim 5, wherein the electrode resistance measuring model includes at least twelve voltage probes and at least two current probes.

8. The method of claim 5, wherein the electrode resistance measuring model further includes a ground probe.

9. The method of claim 1, wherein a current size for measuring the voltage is 1 µA to 100 mA.

10. The method of claim 1, wherein when the standard deviation value is equal to or less than 0.005, dispersibility of the electrode material layer is determined to be excellent.

* * * * *